United States Patent [19]

Kaplan

[11] 4,225,897
[45] Sep. 30, 1980

[54] OVERCURRENT PROTECTION CIRCUIT FOR POWER TRANSISTOR

[75] Inventor: Leonard A. Kaplan, Fords, N.J.

[73] Assignee: RCA Corporation, New York, N.Y.

[21] Appl. No.: 7,499

[22] Filed: Jan. 29, 1979

[51] Int. Cl.$^2$ ............................................. H02H 7/20
[52] U.S. Cl. ................................. 361/87; 330/207 P; 361/93
[58] Field of Search .................... 361/87, 93, 94, 103, 361/98, 101; 330/207 P, 13, 15, 30 D; 328/146, 135; 307/289

[56] References Cited

U.S. PATENT DOCUMENTS

| | | | |
|---|---|---|---|
| 3,924,159 | 12/1975 | Hoover | 361/87 X |
| 3,967,207 | 6/1976 | Wheatley, Jr. | 330/207 P X |
| 4,058,775 | 11/1977 | Crowle | 330/207 P X |
| 4,078,207 | 3/1978 | Leidich | 330/207 P X |

*Primary Examiner*—Patrick R. Salce
*Attorney, Agent, or Firm*—Eugene M. Whitacre; Paul J. Rasmussen; Allen LeRoy Limberg

[57] ABSTRACT

No current sensing resistor is used for sensing overcurrent condition in a power transistor in the disclosed overcurrent protection circuit, avoiding the power loss and reduction of available output potential range for the power transistor associated with the use of such sensing resistor. Instead, a differential comparator means is used to sense when the emitter-to-base potential of the power transistor exceeds that of a reference transistor sufficiently to indicate an overcurrent condition in the power transistor.

5 Claims, 10 Drawing Figures

OVERCURRENT PROTECTION CIRCUIT FOR POWER TRANSISTOR

The present invention relates to overcurrent protection circuitry for power transistors—that is, the transistors used for delivering power to the loads of regulator or amplifier circuitry—and like transistors and, more particularly, to overcurrent protection circuits in which no current sensing resistors are introduced in series with the principal current conducting paths of the protected transistors.

Conventionally overcurrent protection is usually provided by one of two basic protection schemes, each of which employs a current sensing resistor in series with the principal current-conducting path of the protected transistor. In the non-linear degenerative feedback scheme the potential drop across a current sensing resistor in series connection with the collector-to-emitter path of the protected transistor is applied to a threshold detector, which responds to the potential drop exceeding a prescribed threshold value to reduce the base current drive available to the protected transistor. In the non-linear clipper scheme the combined voltages across the base-emitter junction of the protected transistor and a current sensing transistor in series therewith is constrained to a maximum prescribed value by a clipper.

A current sensing resistor in series with the collector-to-emitter path of a protected transistor is undesirable in a power amplifier application, however. The potential drop across the sensing resistor undesirably reduces the range of voltage variation available across the collector-to-emitter path of the protected transistor and therefore the power available from an amplifier using the protected transistor. Some power is consumed in the sensing resistor at higher normal current levels through the protected transistor; this power has to be regarded as a loss that undesirably reduces amplifier efficiency. Another problem is encountered in monolithic integrated circuitry construction in that the current sensing resistors cannot be integrated in a reasonably small portion of the integrated circuit since they must have low resistances (typically a fraction of an ohm) and substantial current conducting capability (typically a few amperes). So it is very desirable to have an overcurrent protection scheme which dispenses with the need for current sensing resistors in series with the collector-to-emitter paths of protected transistors.

The present inventor has discerned that the internal emitter resistance of the transistor itself may be used as the current sensing resistor for overcurrent protection, permitting one to dispense with a separate current sensing resistor. A problem encountered with this approach is that the internal emitter resistance has only a relatively small linear term as a component thereof—i.e., a term where potential drop is in fixed proportion to the emitter current of the protected transistor. The preponderant component of the internal emitter resistance is a logarithmic term—i.e., a term where potential drop is in fixed proportion to the logarithm of the emitter current of the protected transistor. This makes it very difficult—indeed, impossible in the practical sense—to sense changes in potential across this internal emitter resistance by conventional threshold detector or clipper, since these devices generally employ semiconductor junction devices having antilogarithmic conduction versus applied input voltage characteristics and so are not sufficiently sensitive or accurate to afford predictable overcurrent protection. Predictability and reproducibility of result is particularly desirable in overcurrent protection circuits of monolithic integrated-circuit construction, since the use of components that are selected for or adjusted to correct value is to be avoided whenever possible.

A further problem is that internal emitter resistance of the protected transistor has a pronounced dependence upon the operating temperature of the protected transistor. This phenomenon must be taken into account when determining the threshold level at which transistor overcurrent protection is to be afforded.

The present invention solves these problems in overcurrent protection circuitry that uses: a reference transistor, having the protected transistor thermally coupled therewith for tracking the operating temperature of the reference transistor to that of the protected transistor, and being connected for conducting a predetermined level of current through a collector-to-emitter path thereof; differential comparator means differentially comparing the emitter-to-base potentials of the protected and reference transistors for providing an indication of an overcurrent condition with regard to the protected transistor whenever the emitter-to-base potential of the protected transistor rises by a specified amount in comparison to the emitter-to-base potential of the reference transistor; and means responsive to that indication for limiting further increase in the base drive current available to the protected transistor.

Figure 1:
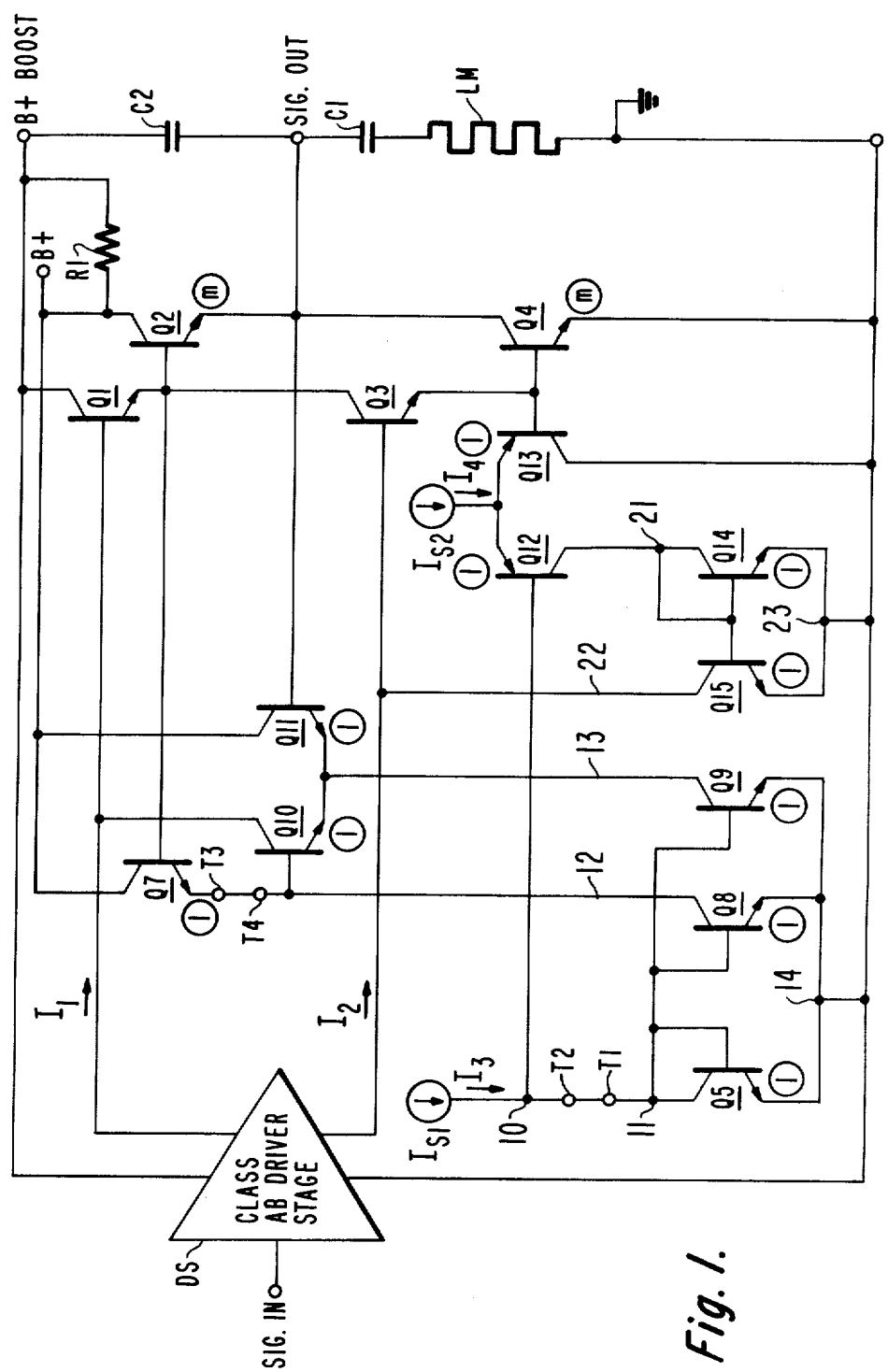
FIG. 1 is a schematic diagram of a quasi-linear amplifier having a pair of output transistors driving a load in Class AB push-pull, which output transistors are provided overcurrent protection by respective overcurrent protection circuits each embodying the present invention.

The FIG. 1 quasi-linear amplifier receives input signals to be amplified at a SIG IN terminal, which are applied to a driver stage DS. Driver stage DS supplies Class AB currents $I_1$ and $I_2$, which have equal positive quiescent components. $I_1$ has positive-going response to excursions of input signal in one sense superimposed on its positive quiescent component, and $I_2$ has positive-going response to excursions of input signal in the other sense superimposed on its positive quiescent components. Driver stage DS may, for example, take a form like that described by C. F. Wheatley, Jr., in U.S. Pat. No. 3,573,645, issued Apr. 6, 1971 and entitled "PHASE-SPLITTING AMPLIFIER".

Driver stage DS supplies $I_1$ from a relatively high source impedance to the base electrode of a common collector amplifier NPN transistor Q1 to provide current-mode drive to Q1 and to the NPN power transistor Q2 driven at its base electrode by the emitter current response of Q1 to its $I_1$ base drive. Driver stage DS supplies $I_2$ from a relatively high source impedance to the base electrode of a common-collector amplifier NPN transistor Q3 to provide current-mode drive to Q3 and to the NPN power transistor Q4 driven at its base electrode by the emitter current response of Q2 to its $I_2$ base drive.

The collector-to-emitter circuits of Q2 and Q4 are connected in series to receive an operating potential applied between the GND and B+ terminals and arranged to provide push-pull drive at the SIG OUT terminal, shown coupled through a d-c blocking capacitor C1 to a load means LM. A B+ boost circuit comprising a booster capacitor C2 between the SIG OUT and B+ BOOST terminals and a resistor R1 between the B+ and B+ BOOST terminals supplies a voltage to the collector of Q1 and to driver stage DS, which will rise above B+ on positive excursions of signal at SIG OUT to permit driving Q2 into saturated conduction. The connection of the collector of Q3 to the emitter of Q1 permits driving Q4 into saturated conduction. The amplifier connections as thus far described are of a sort known in the art at the time of invention.

NPN transistor Q5 is the reference transistor providing the emitter-to-base offset protential $V_{BEQ5}$ against which the emitter-to-base offset potential $V_{BEQ4}$ of Q4, having the same emitter voltage as Q5, is compared. Q5 has direct-coupled collector-to-base feedback adjusting its emitter-to-base voltage so it will demand a collector current substantially equal to the direct current $I_3$ supplied from a current source IS1 to a node 10 to which the collector electrode of Q5 connects via terminals T1 and T2.

NPN transistor Q7 is the reference transistor providing the emitter-to-base offset potential $V_{BEQ7}$ against which the emitter-to-base voltage $V_{BEQ2}$ of Q2, having the same base potential as Q7, is compared. Q7 is a common-collector amplifier transistor the emitter current of which flows in major portion to satisfy the collector current demand of NPN transistor Q8 applied to the emitter of Q7 via terminals T3 and T4. Q8 and NPN transistor Q9 are the slave mirroring transistors in a dual-output current mirror amplifier including Q5 as the master mirroring transistor, having an input connection at 11, having output connections at 12 and 13, and having a common connection at 14. Assuming the effective areas of their respective emitter-base junctions being made equal as indicated by the encircled "1"'s next to their respective emitter electrodes, Q7 and Q5 will have equal emitter-to-base offset potentials $V_{BEQ7}$ and $V_{BEQ5}$, respectively. (This owing to current mirror amplifier action between Q5 and Q8 and to the common-emitter amplifier action of Q8 working into the emitter of Q7 as its collector load.)

Each of the power transistors Q2 and Q4 customarily is in fact a respective plurality of parallelled transistors in a monolithic integrated circuit construction, the equivalent effective area of the emitter-base junction of the power transistor being the sum of the effective areas of the emitter-base junctions of its parallelled component transistors. In any case the equivalent effective areas of the emitter-base junction of Q2 and Q4 are shown as being m times as large as the effective areas of the emitter-base junctions of Q7 and Q5, respectively, m being a positive number. This will result in the offset potentials across the emitter-base junctions of Q2 and Q4 being smaller than those across the emitter-base junctions of Q7 and Q5, respectively, by the factor (KT/q)ln m at similar current levels. This result is obtained by considering the following well-known equation descriptive of transistor action:

$$V_{BE}=(KT/q)ln(I/AJ_S)$$

where $V_{BE}$ is the transistor emitter-to-base voltage,

K is Boltzmann's constant,

T is the absolute temperature of the transistor emitter-base junction, q is the charge on an electron, I is the output current of the transistor, A is the effective area of the transistor emitter-base junction, and $J_S$ is the average density of current flow through the transistor emitter-base junction when $V_{BE}$ is zero-valued. Q5 and Q7 are arranged in intimate thermal coupling with Q4 and Q2, respectively, so the operating temperatures of Q5 and Q7 track those of Q4 and Q2, respectively.

The respective emitter-to-base potentials $V_{BEQ2}$ and $V_{BEQ7}$ of Q2 and Q7 are differentially compared by a pair of NPN transistors Q10 and Q11 in long-tailed pair configuration, the collector of Q9 withdrawing tail current from the interconnection of their emitters. In the configuration shown this tail current will be substantially equal to $I_3$, but other arrangements for generating the tail current can be used. Under normal conditions of output current, $V_{BEQ2}$ will be substantially smaller than $V_{BEQ7}$. So, the more positive emitter potential of Q2 applied to the base of Q11 as compared to the emitter potential of Q7 applied (via terminals T4 and T3) to the base of Q10 will bias Q11 to conduct the tail current demanded as collector current by Q9 and will bias Q10 to be non-conductive. However, when overcurrent conditions are imposed on Q2, $V_{BEQ2}$ increases, biasing Q11 into decreased conduction and biasing Q10 into conduction. The conduction of Q10 is thus an indication of the overcurrent condition in Q2. The collector of Q10 is connected to the base of Q1 for limiting the base current drive to Q1 responsive to this indication of overcurrent condition in Q2, the collector current demand of Q10 when it is conductive being satisfied by the diversion of a portion of $I_1$ from supplying base drive to Q1 and thus to Q2.

Note that tracking of the operating temperatures of Q2, Q7, Q10, and Q11 makes the overcurrent sensing insensitive to these operating temperatures. This, because just as a particular difference between the emitter-to-base voltages of Q2 and Q7 that is proportional to (KT/q) and thus to T is associated with a particular fixed ratio between their output currents over a range of variation in T, that same difference proportional to (KT/q) between the emitter-to-base voltages of Q10 and Q11 is associated with a fixed ratio between their output currents.

The use of NPN transistors Q10 and Q11 in a long-tailed pair configuration for differentially comparing $V_{BEQ2}$ and $V_{BEQ7}$ facilitates the direct application of the collector current demand of Q10 to the $I_1$ output of driver state DS without need for level shifting circuitry.

The respective emitter-to-base potentials $V_{BEQ4}$ and $V_{BEQ5}$ of Q4 and Q5 are differentially compared by a pair of PNP transistors Q12 and Q13 in long-tailed pair configuration. Current source IS2 supplies a direct current $I_4$ as tail current to the interconnection between the emitter electrodes of Q12 and Q13. $I_3$ and $I_4$ can be made of like value to facilitate matching of the overcurrent protection characteristics of the circuits protecting Q2 and Q4.

Under normal conditions of output current, $V_{BEQ4}$ will be substantially smaller than $V_{BEQ5}$. So the less positive base potential of Q4 applied to the base of Q13 as compared to the base potential of Q5 applied (via terminals T1 and T2) to the base of Q12 will bias Q13 to conduct the tail current $I_4$ and will bias Q12 to be nonconductive. However, when overcurrent conditions are imposed on Q4, $V_{BEQ4}$ increases, biasing Q13 into decreased conduction and biasing Q12 into conduction. The resulting collector current of Q12 affords an indication of the overcurrent condition in Q4. This indication is applied to the input connection 21 of a current mirror amplifier configuration including NPN transistors Q14 and Q15, having an output connection 22 to the base of Q3, and having a common connection 23 to the GND terminal. Responsive to the Q12 collector current a collector current of like amplitude is demanded at 22 by Q15. The similarity of the amplitudes of the collector currents of Q12 and Q15 is because of the current mirror amplifier configuration of Q14 and Q15 having a current gain substantially equal to minus unity, owing to the effective areas of the emitter-base junctions of Q14 and Q15 being in 1:1 ratio as indicated by the encircled "1"'s near their respective emitter electrodes. The collector current demand of Q15 is satisfied by a portion of $I_2$, thus limiting further increase in the base drive to Q3 and thus to Q4.

Figure 2:
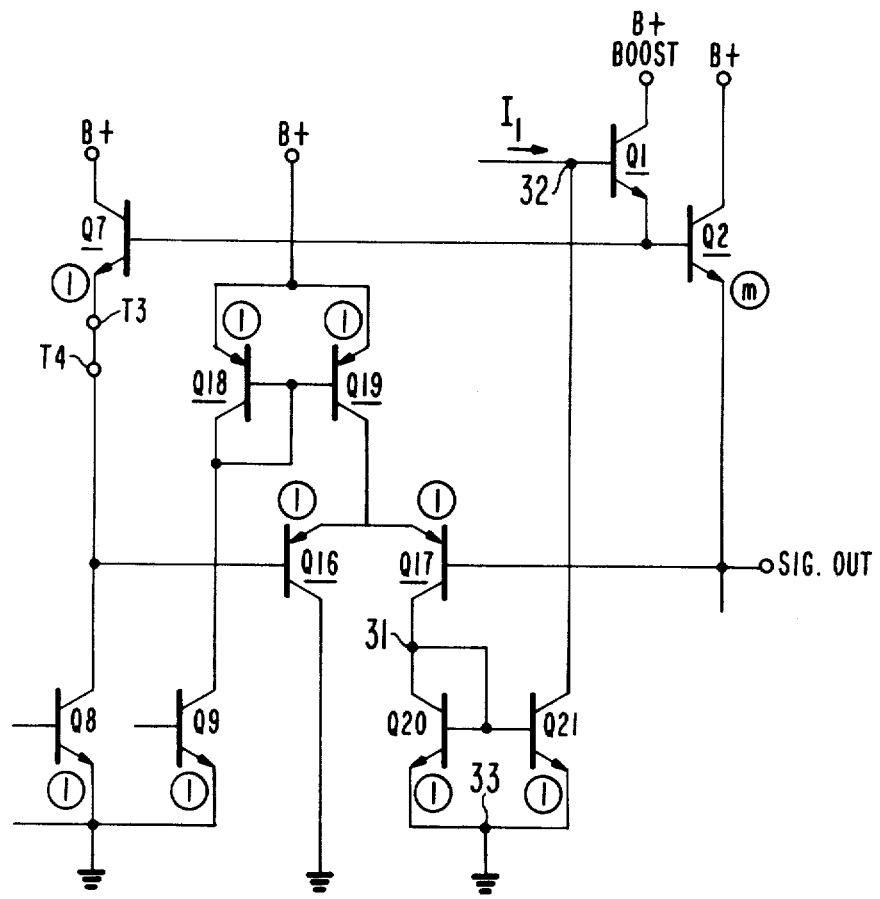
FIGS. 2, 3, 4 and 5 are schematic diagrams of further overcurrent protection circuits embodying the present invention that may replace one or the other of those shown in FIG. 1.

FIG. 2 shows an alternative overcurrent protection circuit for a power transistor, such as Q2 in the FIG. 1 push-pull amplifier, using PNP transistors Q16 and Q17 rather than NPN transistors Q10 and Q11 in long tailed pair configuration to differentially compare $V_{BEQ2}$ and $V_{BEQ7}$. Positive tail current is supplied to the interconnected emitter electrodes of Q16 and Q17—for example by using a current mirror amplifier configuration of PNP transistors Q18 and Q19 to invert the collector current of Q9, as shown. Under normal conditions of output current, the smaller $V_{BEQ2}$ will bias the base of Q17 to considerably more positive value than the larger $V_{BEQ7}$ will bias the base of Q16. So Q16 will conduct all the tail current from the collector of Q19, and Q17 will be nonconductive. However, when overcurrent conditions are imposed on Q2, $V_{BEQ2}$ increases, biasing Q16 into decreased conduction and Q17 into conduction. The collector current of Q17 is applied to the input connection 31 of a current mirror configuration of NPN transistors Q20 and Q21, the output connections 32, of which connects to the base electrode of Q1, and the common connection 33 of which is grounded. Responsive to the collector current of Q17, Q21 demands collector current, which demand is satisfied from $I_1$, limiting further increase in the base drive to Q1 and thus to Q2.

Figure 3:
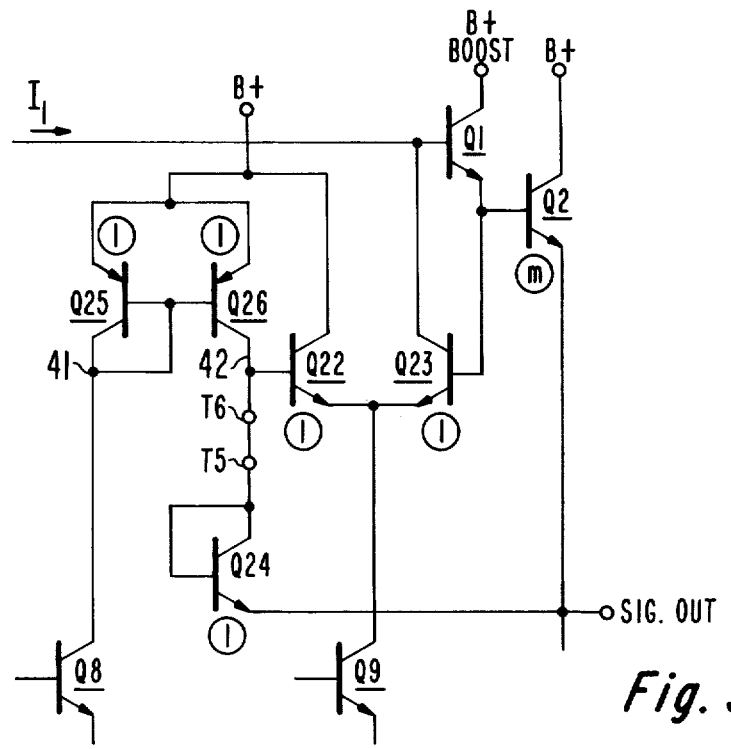

FIG. 3 shows another alternative overcurrent protection circuit for a power transistor such as Q2 in the FIG. 1 push-pull amplifier. Transistors Q22 and Q23, used to compare the emitter-to-base voltage $V_{BEQ2}$ of the protected transistor Q2 to the emitter-to-base voltage of the diode-connected NPN reference transistor Q24, are NPN just as Q10 and Q11 in FIG. 1. However, Q22 and Q23 compare the base rather than the emitter potentials of Q2 and Q24, Q2 and Q24 having the same emitter potentials because of the direct connection without intervening elements between their emitter electrodes. A current mirror amplifier configuration of PNP transistors 25 and 26 has an input connection 41 upon which the collector current demand of Q8 is applied, an output connection 42 for supplying forward bias current (proportional to the collector current demand of Q8) to the diode-connected reference transistor Q24, and a common connection to B+. At normal levels of current in Q2, Q22 will be biased to conduct all the tail current demanded at the collector of Q9 and its collector connects to B+. When overcurrent conditions are imposed on Q2 increased $V_{BEQ2}$ biases Q23 into conduction and Q22 into decreased conduction. The collector electrode of Q23 connects to the base of Q1 and its collector current demand is met by diverting a portion of $I_1$ away from the base of Q1 to limit further increase in the base drive to Q1 and thus to Q2.

Figure 4:
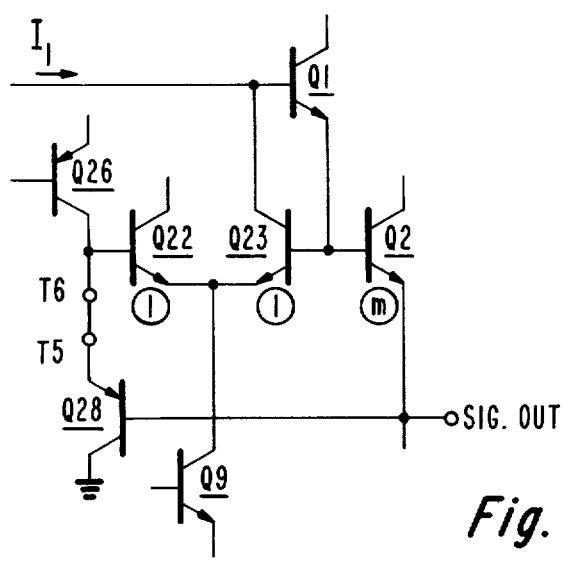

FIG. 4 shows a modification of the FIG. 3 wherein a PNP emitter-follower transistor Q28 replaces diode-connected NPN transistor Q24 as reference transistor. This reduces the fraction of the collector current of Q26 which flows to the SIG OUT terminal. Being grounded-collector, Q28 can be a vertical-structure transistor having its collector in the substrate of conventional monolithic integrated circuit construction using reverse-biased junction-isolation between circuit elements, rather than being a lateral-structure transistor if one so desires.

Figure 5:
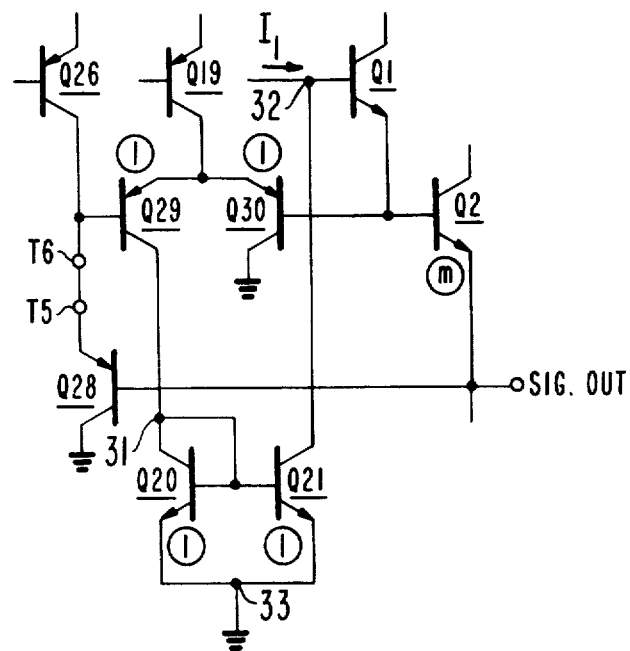

FIG. 5 shows a still further modification using PNP differential comparator transistors Q29 and Q30 instead of NPN transistors Q22 and Q23. The interconnected emitter electrodes of Q29 and Q30 are supplied current in similar way as the interconnected emitter electrodes of Q16 and Q17 of FIG. 2, and a current mirror amplifier configuration of Q20 and Q21 is used to couple the collector current demand of Q29 to the base of Q1 during overcurrent conditions.

The long-tailed pair configurations used as differential comparators are shown as being of balanced type with Q10 and Q11, Q12 and Q13, Q16 and Q17, and Q22 and Q23 in each pair being matched transistors. However, the effective area of the emitter-base junction of Q11 may be made n times that of the emitter-base junction of Q10, where n is a number larger than unity, resulting in an unbalanced long-tail pair configuration that raises the level at which overcurrent protection is afforded protected transistor Q2 relative to the level of collector-to-emitter current in reference transistor Q7. The other long-tailed pairs may be similarly unbalanced for similar reasons.

Figure 6:
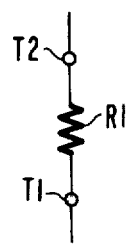
FIGS. 6, 7 and 8 are schematic diagrams of modifications that can be made to the embodiments of the invention shown in FIGS. 1-5.
Figure 7:
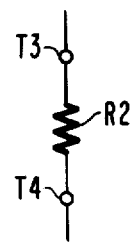
Figure 8:
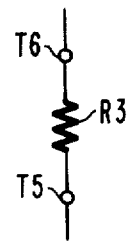

Another technique to raise the level at which overcurrent protection is afforded the protected transistor relative to the level of current flowing through the reference transistor is to simulate the reduction of the area of the reference transistor, which can be done by adding the drop across a resistor to its emitter-to-base voltage. FIG. 6 shows the introduction of a resistor R1 between terminals T1 and T2, for augmenting the emitter-to-base voltage $V_{BEQ5}$ of reference transistor Q5 in FIG. 1. FIG. 7 shows the introduction of a resistor R2 between terminals T3 and T4, for augmenting the emitter-to-base voltage $V_{BEQ7}$ of reference transistor Q7 in FIG. 1 or FIG. 2. FIG. 8 shows the introduction of a resistor R3 between terminals T5 and T6, for augmenting the emitter-to-base potential $V_{BEQ24}$ of reference transistor Q24 in FIG. 3, or for augmenting the emitter-to-base potential $V_{BEQ28}$ of reference transistor Q28 in FIG. 4 or FIG. 5. The independence of the overcurrent protection from operating temperature can be maintained by making $I_3$ to have such a temperature coefficient that the potential drop across a resistor such as R1, R2 or R3 varies proportionately with the absolute temperature at which the protected and reference transistors are operated.

A good way to do this is to use a current source IS1 in which the supplied current I3 is proportional to the current flowing in a resistor, which resistor has maintained thereacross a potential proportional to KT/q by reason of being equal to the difference between the emitter-to-base voltages of two transistors operated at the same temperature, and which resistor is operated at the same temperature and has the same temperature coefficient of resistance as R1, R2 or R3. Two-terminal current regulators of this general type are specifically described by:

(a) Wheatley in U.S. Pat. No. 3,629,691 patented Dec. 21, 1971 and entitled "CURRENT SOURCE", (b) van de Plassche in U.S. Pat. No. 3,911,353 patented Oct. 7, 1975 and entitled "CURRENT STABILIZING ARRANGEMENT", (c) Dobkin in U.S. Pat. No. 3,930,172 patented Dec. 30, 1975 and entitled "INPUT SUPPLY INDEPENDENT CIRCUIT", and (d) Crowle in U.S. Pat. No. 4,063,149 patented Dec. 13, 1977 and entitled "CURRENT REGULATING CIRCUITS", amongst others.

Figure 9:
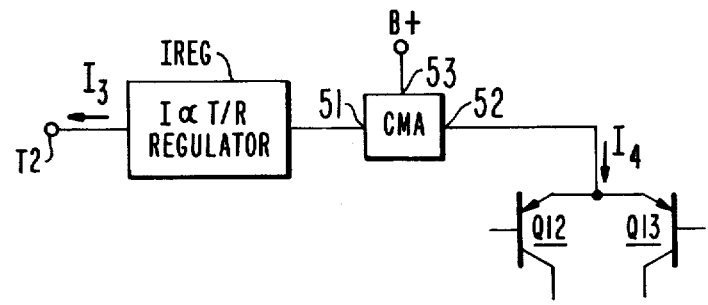
FIG. 9 is a block schematic diagram of a current supply arrangement advantageously used in embodiments of the present invention.

FIG. 9 shows any one of these two-terminal current regulators IREG connected at one of its terminals to terminal T2 of the FIG. 1 quasi-linear amplifier and connected at the other of its terminals to the input connection 51 of a current amplifier CMA, thence through the input circuit of CMA to its common connection 53, and thence to B+ operating potential. The output connection 52 of CMA supplies a tail current I4 proportional to I3 to the interconnected emitter electrodes of Q12 and Q13.

Figure 10:
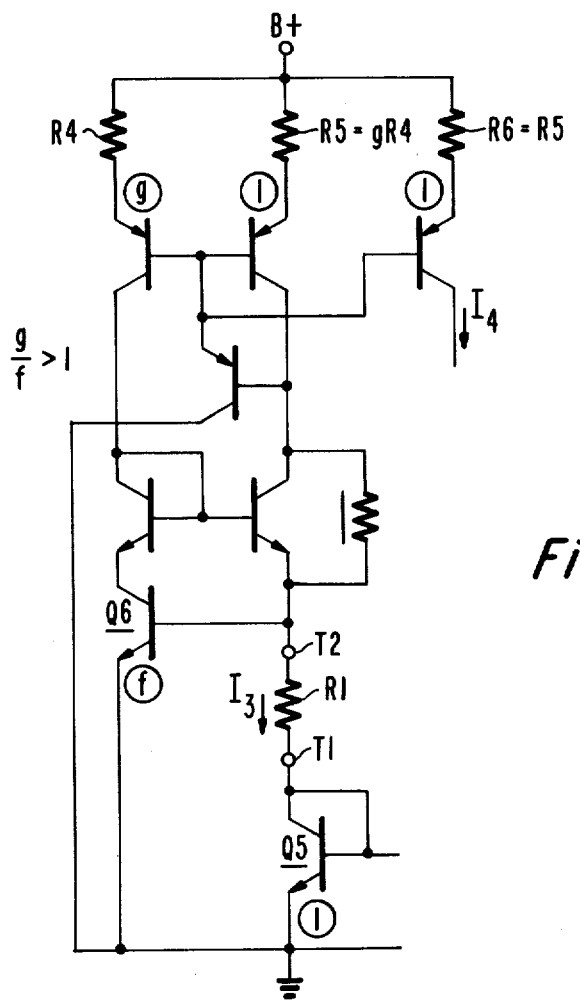
FIG. 10 is a schematic diagram representative of another current supply arrangement advantageously used in embodiments of the present invention.

One may also develop a voltage proportional to KT/q across one of the resistors R1, R2 and R3 by imposing across it a potential equal to the difference in the emitter-to-base potentials of two transistors. FIG. 10 shows a configuration similar to that described by Wheatley in U.S. Pat. No. 3,629,961 for imposing a potential equal to the difference between the respective emitter-to-base potentials $V_{BEQ5}$ and $V_{BEQ6}$ of NPN transistors Q5 and Q6 across R1.

Those skilled in the art and armed with the foregoing disclosure will readily design numerous other variants of the invention and the following claims should be liberally construed to include in their scope all such overcurrent protection devices in the spirit of the present invention.

What is claimed is:

1. In an electronic circuit with a protected transistor having base and emitter electrodes with an emitter-base junction therebetween, having a collector electrode, and being connected for receiving a base drive current and an emitter-to-collector potential, an overcurrent protection circuit for said protected transistor comprising:

a reference transistor having base and emitter electrodes with an emitter-base junction therebetween, having a collector electrode, and having said protected transistor thermally coupled therewith for tracking the operating temperature of said reference transistor to that of said protected transistor;

means connecting said reference transistor for conducting a predetermined level of current through a collector-to-emitter path thereof;

differential comparator means connected to compare the emitter-to-base potential of said protected transistor to that of said reference transistor for providing an indication of an overcurrent condition with regard to said protected transistor whenever its emitter-to-base potential increases by specified amount in comparison to the emitter-to-base potential of said reference transistor; and means responsive to said indication of an overcurrent condition for limiting further increase in the base drive current available to said protected transistor.

2. An overcurrent protection circuit as set forth in claim 1 wherein said differential comparator means includes:

a pair of further transistors of similar conductivity type having respective input, output and common electrodes; and means connecting these further transistors in long-tailed-pair configuration including means for applying the emitter-to-base potentials of said reference and protected transistors to respective ones of the input electrodes of said further transistors, means for applying a tail current to an interconnection of the common electrodes of said further transistors, and means for deriving said indication of an overcurrent condition from the output electrode of the one of said further transistors least conductive in the absence of said overcurrent condition.

3. An overcurrent protection circuit as set forth in claim 1 wherein said differential comparator means includes:

a resistor having first and second ends;

means connecting said resistor in series with the collector-to-emitter path of said reference transistor for conducting the same predetermined level of current;

means connecting said resistor so the potential drop thereacross responsive to said predetermined level of current adds to the emitter-to-base potential of said reference transistor to provide a sum voltage between the first end of said resistor and one of the base and emitter electrodes of said reference transistor including a connection of the other of the base and emitter electrodes of said reference transistor to the second end of said resistor;

a pair of further transistors of similar conductivity type having respective input, output and common electrodes; and means connecting these further transistors in long-tailed-pair configuration including means for applying the emitter-to-base potential of said protected transistor to the input electrode of one of said further transistors and for applying said sum voltage to the input electrode of the other of said further transistors, means for applying a tail current to an interconnection of the common electrodes of said further transistors, and means for deriving said indication of an overcurrent condition from the output electrode of the one of said further transistors least conductive in the absence of said overcurrent condition.

4. An overcurrent protection circuit as set forth in claim 3 wherein said means connecting said reference transistor for conducting a predetermined level of current includes a further resistor having first and second ends, means for impressing a potential between the first and second ends of said further resistor which is equal to the difference between the emitter-to-base potentials of a pair of transistors, and means for generating said predetermined level of current proportional to the current flowing through said further resistor.

5. An overcurrent protection circuit as set forth in claim 3 wherein said means connecting said reference transistor for conducting a predetermined level of current includes means for impressing a potential between the first and second ends of said resistor which is equal to the difference between the emitter-to-base potentials of a pair of transistors.

* * * * *